United States Patent [19]

Dunaway et al.

[11] Patent Number: 5,139,610
[45] Date of Patent: Aug. 18, 1992

[54] METHOD OF MAKING A SURFACE ETCHED SHADOW MASK

[75] Inventors: Thomas J. Dunaway, St. Louis Park; Richard K. Spielberger, Maple Grove, both of Minn.

[73] Assignee: Honeywell Inc., Minneapolis, Minn.

[21] Appl. No.: 607,289

[22] Filed: Oct. 31, 1990

Related U.S. Application Data

[62] Division of Ser. No. 341,637, Apr. 20, 1989, Pat. No. 4,980,240.

[51] Int. Cl.$^5$ .................... C23F 1/02; B05D 1/32; H01L 21/02
[52] U.S. Cl. .................... 156/656; 156/644; 156/664
[58] Field of Search ............. 427/272; 118/504, 721; 428/596, 600; 156/654, 659.1, 644, 664, 656

[56] References Cited

U.S. PATENT DOCUMENTS

| | | | |
|---|---|---|---|
| 2,341,702 | 2/1944 | Duggan | 118/504 |
| 2,596,617 | 5/1952 | Teal | 156/654 |
| 3,275,423 | 10/1966 | Triller | 118/504 |
| 3,286,690 | 11/1966 | McGlasson et al. | 118/504 |
| 3,574,012 | 4/1971 | Penberg | 118/504 |
| 3,653,900 | 4/1972 | Black | 156/644 |
| 3,678,892 | 7/1972 | Fairchild | 118/504 |
| 3,688,740 | 9/1972 | Gesche | 118/504 |
| 3,780,700 | 12/1973 | LaFleur et al. | 118/504 |
| 3,824,014 | 7/1974 | Abita | 118/504 |
| 4,105,493 | 8/1978 | Chaung | 156/644 |
| 4,256,532 | 3/1981 | Magdo et al. | 118/504 |
| 4,391,034 | 7/1983 | Stuby | 118/504 |
| 4,417,946 | 11/1983 | Bohlen et al. | 156/644 |
| 4,588,474 | 5/1986 | Gross | 156/654 |
| 4,669,416 | 6/1987 | Delgado et al. | 118/504 |
| 4,728,392 | 3/1988 | Miura et al. | 156/654 |

FOREIGN PATENT DOCUMENTS 119282 12/1944 Australia .................... 118/504

*Primary Examiner*—John Zimmerman
*Attorney, Agent, or Firm*—Gregory A. Bruns

[57] ABSTRACT

A scratch reducing shadow mask for providing vapor deposition patterns of bonding metals onto a surface of a die. The shadow mask comprises a top surface and a bottom surface which define a plurality of vias for permitting vaporized bonding metals to pass through the mask. Mask bottom surface comprises a plurality of recessed regions to minimize the contact area of the mask with the die during the vapor deposition process.

14 Claims, 5 Drawing Sheets

METHOD OF MAKING A SURFACE ETCHED SHADOW MASK

This is a division of application Ser. No. 07/341,637, filed Apr. 20, 1989 now U.S. Pat. No. 4,980,240.

FIELD OF THE INVENTION

The present invention relates to the field of electronic component manufacturing and packaging.

BACKGROUND OF THE INVENTION

In the field of electronic component manufacturing and packaging, numerous problems exist. One problem in the manufacturing of semiconductor chips is inefficiency and imprecision with respect to placement and location of conductive metalization. For example, when producing semiconductor chips or wafers, the use of screening masks frequently damages the chips or wafers. This generally occurs when prior art vapor deposition masks move while in contact with a wafer or chip surface. This induces scratching and, when foreign material is between the mask and the wafer or chip surface, puncturing may occur. Additionally, the construction of these masks may permit undesired deposition of metalization during the vapor deposition process onto various parts of the chip or wafer surface. This results in a pattern of conductive metalization which generates unwanted electrical shorts between predetermined bond sites. The present invention provides improvements affecting the production and operation of electronic devices and assemblies, and overcomes the problems identified above.

SUMMARY OF THE INVENTION

The present invention is a method of manufacturing a yield-enhancing shadow mask for providing vapor deposition patterns of bonding metals onto input/output interconnect locations of a semiconductor die while preventing damage to active regions of the die. The present invention comprises providing a shadow mask having a top surface and a bottom surface. Applicable dimensions of the semiconductor die are obtained and transferred to the shadow mask in order to define a plurality of vias in the shadow mask located in alignment with the input/output interconnect locations of the die for permitting vaporized bonding metals to pass through the mask and deposit onto the input/output interconnection locations. Applicable dimensions of the semiconductor die are also obtained and transferred in order to form the mask bottom surface so that it comprises a plurality of recessed regions which minimize the contact area of the mask with the die during the process of vapor deposition. The recessed regions are formed so that they surround substantially full-mask-thickness walls which define the vias aligned with the input/output interconnect locations of the die and which provide damming action to retain the vapor deposit to within a limited distance of the input/output interconnection locations of the die as defined by the vias. The forming step comprises forming the recessed regions in the mask so that they are formed over active regions of the die in order to avoid damage to the active regions from contact with the mask, thus increasing the yield of reliable die during the production process.

DETAILED DESCRIPTION OF THE PREFERRED EMBODIMENTS

Detailed preferred embodiments of the present invention are disclosed. It is to be understood, however, that the disclosed embodiments are merely exemplary of the invention, which may be embodied in various forms. Therefore, specific structural and functional details disclosed are not to be interpreted as limiting, but rather as a representative basis for teaching one skilled in the art to variously employ the present invention in virtually any appropriately detailed system or structure. It will be understood that in some circumstances relevant material thicknesses and relative component sizes may be shown exaggerated to facilitate an understanding of the invention.

Inventions described in the present application relate to improvements in manufacturing, bonding, and packaging of electronic components to achieve improved reliability, improved yield, and greater material and manufacturing efficiencies. The improvements comprise unique features including etched shadow mask construction, conductive metalized bump composition, and preferred structure of tape leadframes.

Figure 1:
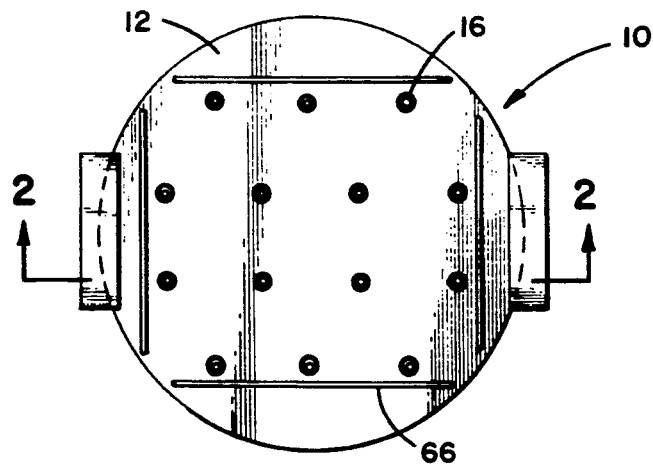
FIG. 1 is a top plan view of a shadow mask and die assembly showing shadow mask vias.

Referring to FIG. 1, an exemplary mask 10 is illustrated. It is appreciated that masks, also known as shadow masks or vapor deposition masks, are variously constructed and shaped; however, the basic function of masks is to provide vapor deposition patterns for conductive material to be evaporated onto a die thereunder. Accordingly, mask 10 comprises a mask top surface 12 which defines apertures or vias 16. Mask 10 is removably mounted on a surface of a die and positioned in a chamber in which evaporation and deposition of solderable material will occur. During the evaporation and deposition process, the solderable material passes through vias 16 in mask 10 and is deposited in a pattern on the die. This provides a pattern of solderable material on the die for later reflowing, bonding, or other operations.

Frequently, prior art masks experience warping or other reshaping so that vaporized solderable material passes through the vias and is deposited on various portions of the die which were not directly beneath each via area. This results in unwanted electrical shorts being created on the die. Yet another problem exists with prior art masks wherein a substantial portion of the mask surface is in contact with the die when the mask is agitated or slightly moved. This often results in scratching of the die surfaces. These problems substantially reduce the yield of reliable die during the production process. Due to the expensive recovery required in repair of poorly manufactured or damaged dies, many such devices are discarded. It is appreciated, therefore, that the associated yield problem results in waste and inefficiency in the industry.

Figure 2:
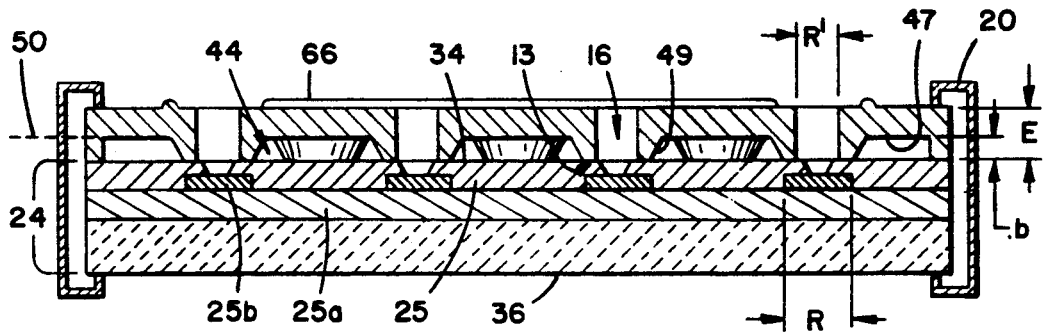
FIG. 2 is a side elevation cross section view taken generally along line 2—2 of FIG. 1 showing a shadow mask removably attached to a die representing a wafer or chip.
Figure 3:
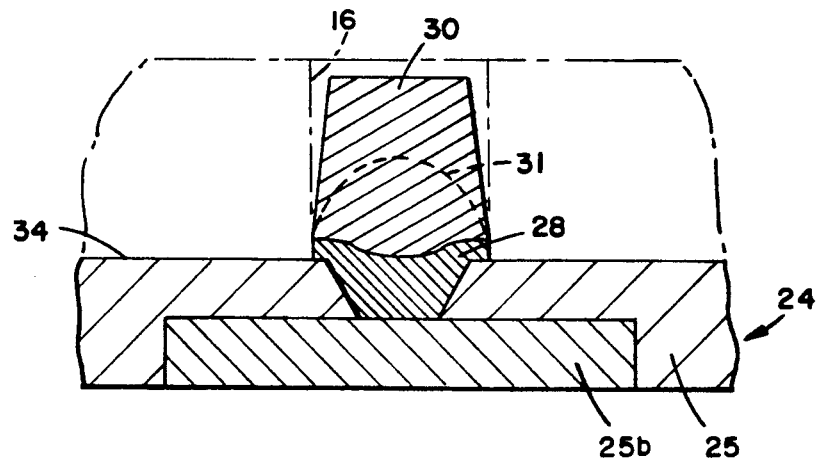
FIG. 3 is an enlarged cross sectional elevation view of a portion of the die shown in FIG. 2 illustrating deposited solderable material on a portion of the die after the mask is removed from the die.

FIG. 2 is a side elevation cross section view taken generally along lines 2—2 of FIG. 1 showing mask 10 removably mounted onto die 24 by mounting means 20. Die 24 may comprise a semiconductor chip, or a wafer comprising numerous semiconductor chips. Die 24 may comprise various materials and layers, however, a representative material combination in the die upper passivation region 25 includes a passivation portion 25a, such as silicon nitride, or more generally an insulator material, and a metalized portion 25b, such as aluminum, or more generally a conductive metalization. As is well known in the field, metalized portions 25b comprise conductive interconnects and are, therefore, deposition sites for later depositing of the vaporized solderable material. More specifically, interface metalization 28, shown in FIG. 3, is commonly deposited first onto metalized portion 25b, and then solderable bump material 30, also shown in FIG. 3, is then vapor deposited through vias 16 onto interface metalization 28.

FIG. 2 shows die 24 comprising top surface 34 and bottom surface 36. FIGS. 2 and 3 therefore illustrate die 24 having a plurality of deposit sites etched or otherwise positioned to provide solderable material in the form of bumps onto interface metalization 28, and extending generally from die top surface 34. In order to precisely position vaporized solderable material at these particular desired deposition sites, a mask of suitable rigidity and via pattern must be used. Such masks are frequently made of metallic materials, as preferably is mask 10, which is typically constructed of molybdenum; however, other materials may be utilized such as glass or plastic.

Mask 10 comprises mask top surface 12 which functions as an outer surface facing away from die 24 in operation, and which is located opposite mask bottom surface 13. As shown in FIG. 2, vias 16 extend through mask 10 between top surface 12 and bottom surface 13 to permit vaporized bonding metals to pass through the mask and to deposit onto predetermined locations of die 24. As further shown in FIG. 2, mask bottom surface 13 comprises a plurality of recessed regions 44. Regions 44 are constructed to minimize the area of mask 10 in contact with die 24 during the vapor deposition process. Moreover, the arrangement of recessed regions 44 in relation to bottom surface 13 surrounding vias 16 provides for substantially full mask thickness via regions having a width labelled R which provide damming action about the via to retain the vapor deposit within the predetermined deposit sites of die 24 defined by the via regions.

Another way of describing the relation between recessed regions 44 and vias 16 is to describe the recessed regions 44 as having a base surface 47 which are constructed and arranged for placement at a distance E from die surface 34. Thus, mask 10 bottom surface 13 includes etched recessed regions 44 which define a projection 49 located around each via 16. Projections 49 extend from the plane or planes 50 which includes base surfaces 47 of etched recessed regions 44 to minimize the contact area of mask 10, to only that area of bottom surface 13, in contact with die 24 during the entire process of vapor deposition.

By reducing the surface area of mask 10 actually in contact with die 24, the risk of the mask damaging the die is greatly reduced. Moreover, this mask construction allows the clamping or retaining force of mounting means 20 to be advantageously focused onto the areas defined by bottom surface 13 immediately surrounding vias 16. Thus, a secure fit of mask 10 results and unwanted deposition of solderable material beyond the area on the die defined by the diameters of each via 16, shown in FIG. 2 as R', is prevented. Prior art shadow masks have failed to adequately contain solderable materials and have frequently resulted in undesired and uncontrolled seepage of such materials between predetermined deposition sites, resulting in electrical shorts and reduced capabilities of the devices involved.

It is to be understood that as the number of vias on mask 10 increases, an increasing area of mask bottom surface 13 is required to achieve the objectives stated above. Also, as the density of vias 16 increases, then undesired flexing or loss of rigidity of mask 10 may occur. Therefore, reinforcing ridges 66, shown in FIGS. 1 and 2, may be utilized for stiffening mask 10. Reinforcing ridges 66 may be arranged in various orientations and shapes to achieve the advantages within the scope of this invention. Indeed, reinforcing ridges 66 need not be limited to protrusions from top surface 12 but instead may comprise material which is hardened in relation to the mask material comprising the remainder of mask 10.

In a preferred embodiment, mask 10 comprises a molybdenum mask having a full thickness of 4 mils. Preferred mask 10 may be used with a die having passivation and metalization combined thickness of approximately 20 mils. Moreover, such a combination would provide means for depositing about a 0.5 micron thin film interface metalization 28, and a subsequent 100 micron thickness solderable material 30, as shown generally and not to scale in FIG. 3. It is appreciated that sizes and shapes shown herein may vary considerably with each production requirement. The substantial reduction of contact surface area between mask 10 and die 24 is most relevant, as is the manner in which mask 10 prevents unwanted deposition of conductive metalization onto areas of die 24 beyond the via areas labelled by diameter R'.

A method of manufacturing a damage reducing etched shadow mask 10 for providing vapor deposition patterns of bonding metals onto a surface of die 24 is also provided. This method preferably comprises the steps of providing a nonwettable shadow mask 10 having top surface 12 and bottom surface 13; creating vias 16 extending through mask 10; and etching portions of mask 10 bottom surface 13 to provide recessed regions 44 and substantially full thickness regions (having height labelled E and width comprising the thickness of R-R' as shown in FIG. 2), the recessed regions 44 providing for a reduced surface area in contact with die 24 during a vapor deposition process. The etching step may further comprise providing projections 49 or ridges extending annularly from vias 16 at bottom surface 13 of mask 10. Mask 10 permits manufacture and deposition through evaporation of a plurality of bumps comprising solderable conductive bump material 30, FIG. 3, and which is shown in shadow 31 in a reflowed configuration.

Figure 4A:
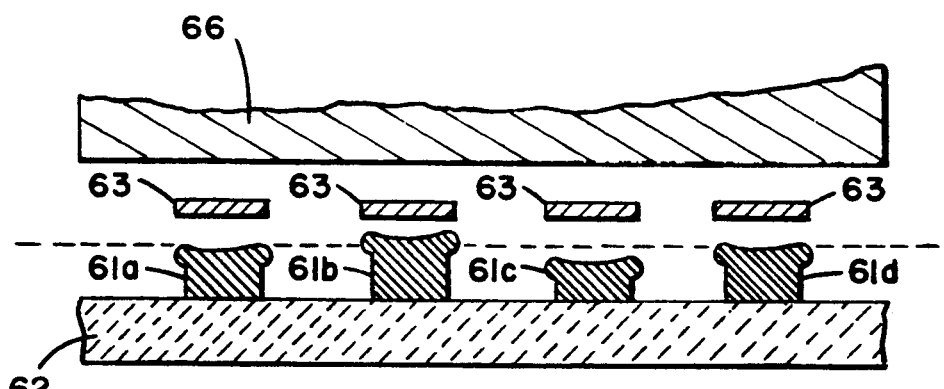
FIGS. 4a and 4b are cross section elevation views of a prior art leadframe/gold bump bonding process showing both incomplete leadframe-to-gold bump bonding and a fractured die.

Within the field of electronic component manufacturing and packaging, serious problems exist due to inadequate uniformity of conductive bump height, unacceptable organic matter within packages, fatigue-prone bonds, and temperature sensitive components. An example of non-uniform conductive bump heights is shown in FIG. 4a in which prior art gold bumps 61a, 61b, 61c, and 61d are arranged on die 62. As illustrated, bumps 61a, 61b, 61c, and 61d have different heights representative of the non-uniformity of bump heights often present in such structures. In a typical prior art process, a representative leadframe assembly is positioned over die 62 and the bumps, with the leadframe assembly comprising conductive metal leads 63.

Figure 4B:
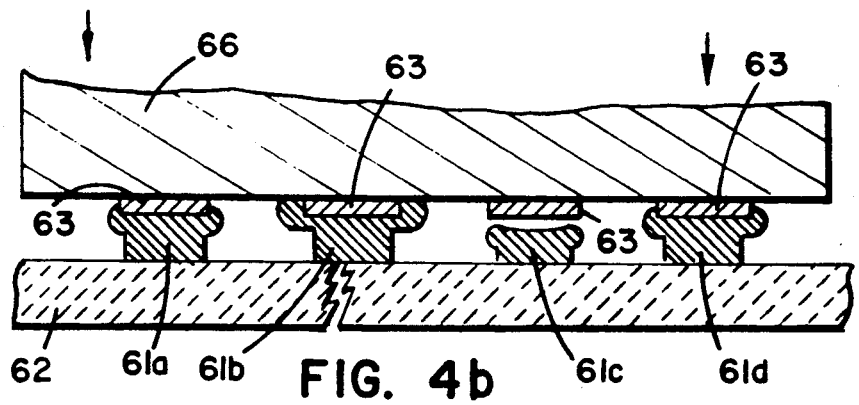

FIG. 4b illustrates the structures of FIG. 4a after a planar bonding force has been applied to leads 63 by bonding tip means 66. As is shown in the figure, the bonding force has caused die 62 to fracture below gold bump 61b due to the high bump height of that bump. As is also shown, leads 63 have contacted and bonded with correspondingly located bumps 61b and 61d. However, solder bump 61c has not bonded with its lead due to the short bump height of bump 61c. This results in non-conductivity and improper performance of a device using die 62 and relying on a bond between bump 61c and its lead.

Figure 5A:
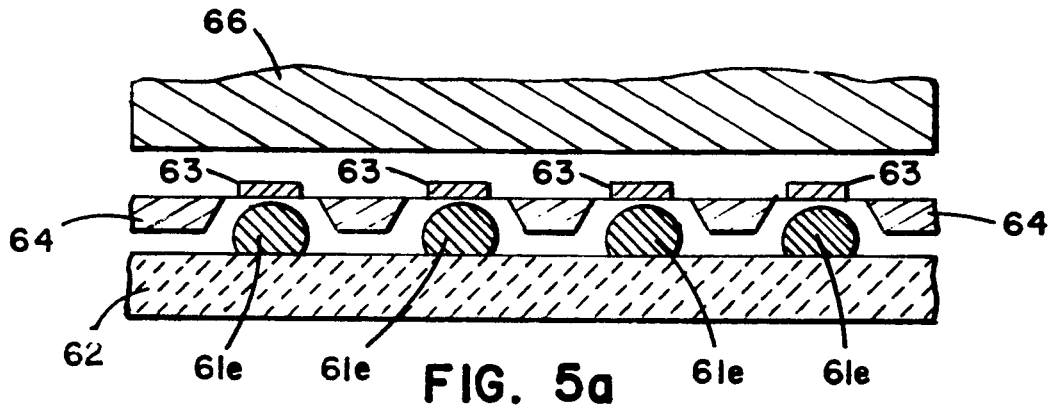
FIGS. 5a and 5b are cross section elevation views of a leadframe with organic standoff means arranged for bonding with solder bumps.
Figure 5B:
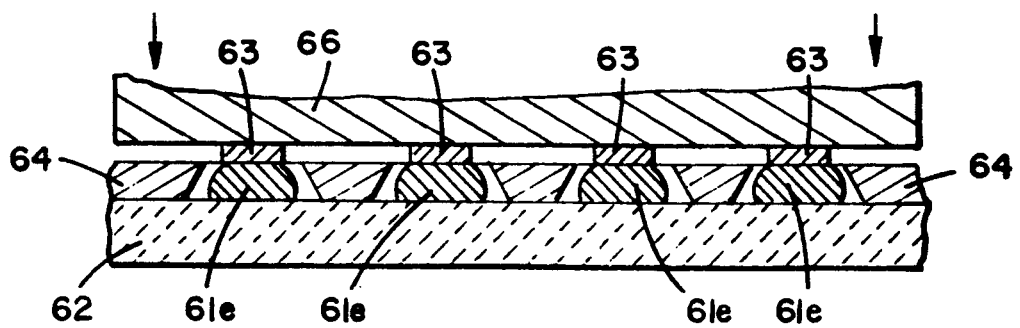

FIG. 5a and 5b are cross section elevation views of a leadframe with organic standoff means arranged for bonding with solder bumps. Height standoff means 64 is commonly provided to prevent overcompression of leads 63 into the conductive bonding material of relatively soft bumps such as solder bumps 61e which do not maintain a uniform standoff height when bonding tip means 66 is brought into contact with leads 63 to form a connection between leads 63 and die 62 via the solder bump 61e. Height standoff means 64, or dielectric means, is frequently constructed of organic material which is subject to moisture collection and long term deterioration.

The present tin cap on solid base bump invention solves the problems illustrated in FIGS. 4b and 5b. With the present tin cap on solid base bump invention, cracking of die 62 under prior art gold bumps such as 61b is substantially reduced when such prior art gold bumps are replaced by the present tin cap on solid base bump invention. Further, open connections such as shown above prior art gold bump 61c in FIG. 5b are substantially reduced when such prior art gold bumps are replaced by the present tin cap on solid base bump invention. In addition, when the present tin cap on solid base bump invention is used to replace prior art solder bumps 61e, height standoff means 64 comprising organic material can be eliminated, thus creating the option of a package free of organic material, consistent with requirements such as those of U.S. Department of Defense Military Standard 38510.

Figure 6:
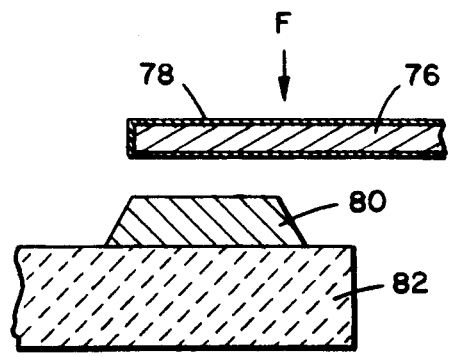
FIG. 6 is a side elevation view depicting a schematic prior art tin coated copper leadframe being positioned for bonding to a gold metalization bump.

It is to be understood that within the field of electronic component manufacturing and bonding another problem exists with respect to inadequate means for strong and efficient bonding of leads to various devices. For example, the bonding forces and temperatures needed for bonding prior art leads often caused cracking of integrated circuit devices and open bonds. These phenomena led to plating of leads, commonly copper leads, with tin in order to lower the force and temperature requirements for bonding. However, that solution led to yet another problem known as whiskering, which occurred principally during the tin plating process. This problem relates particularly to copper leads 76 such as depicted in FIG. 6 that are plated or coated with a solderable material 78 such as tin. Plated lead 76 is shown prior to bonding to a conductive metalized bump 80 located on a semiconductor device 82. This new problem was addressed in the art either by providing additional processes to achieve tin stress relief or by plating the copper or other metal leadframes with gold or other metals. Those solutions, however, are relatively very time consuming and expensive, and are therefore less preferable to the low cost solution of the present tin cap on solid base, such as gold, bump invention.

Figure 7:
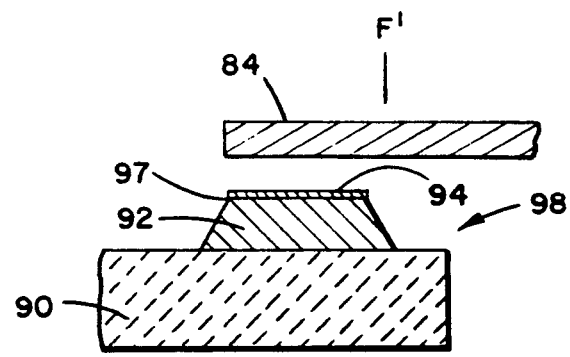
FIG. 7 is a side elevation view depicting a schematic copper leadframe shown in position for bonding to a tin cap solid base metalization bump.

As illustrated in FIG. 7, conductive lead 84, such as a portion of a conductive metalized leadframe, is provided. A schematic conductive metalized bump 98 is also shown positioned on a die 90. Bump 98 preferably comprises a bump lower portion 92 comprising a gold base material of substantially 100% by weight gold to provide a substantially fixed standoff height during the bonding process. Bump 98 preferably also comprises a bump upper portion 94 comprising an effective amount of tin deposited on a top surface 97 of the gold base material comprising the bump lower portion 92. Preferred tin cap on gold base bump 98 provides improved means for interconnecting electronic components and comprises improved fatigue and expansion coefficient properties over solder bumps on dies. This gold-tin combination bond provides a high strength reflowable alloy.

As an alternative to lower portion 92 comprising substantially 100% by weight of gold, a suitable base material may be comprised of at least one metal selected from a group consisting of chrome, nickel, titanium-tungsten, cobalt, and copper. Of particular relevance, however, is the manner in which the bump lower portion 92 provides effective standoff height during the bonding process and the manner in which the tin cap material permits lead travel well into the bump structures during the bonding process so that the bump height uniformity tolerances may be less severe. It is to be understood, however, that a tin cap on a solid base bump may be employed without using only a gold base. For example, as indicated above, a solid base of nickel or other suitable conductive material is within the scope of this invention.

Further, by use of preferred bump 98, the previously identified problems of the prior art are solved using a relatively inexpensive combination and arrangement of materials. By plating tin on top of a gold base and then reflowing the tin during a bonding process, a gold-tin joint is achieved between a die and a leadframe. This provides for the manufacture of gold tin alloy bumps which simplify the leadframe-to-chip bonding process as compared with tin or gold plated copper leads and gold bumps, which often result in a cracked die, or which display the tin whiskering described above.

The use of a bump comprising a tin cap upper portion 94 on a solid base lower portion 92, provides standoff height independent of any requirement for organic material attached to either the lead 84 or the die 90. Accordingly, a bump is provided for use in interconnecting electronic components which meets the organic matter prohibition of U.S. Department of Defense Military Standard 38510, and similarly restricted military standards. This results in substantially improved reliability for electronic components. Moreover, such construction facilitates the type of mass bonding known as "gang bonding" for high-density electronic devices by easing the restrictions for planarity with respect to bond height. In other words, the individual bond heights of a plurality of bumps 98 need not be precisely the same due to the phenomenon of the tin material comprising the bump upper portion 94 providing relief for proper penetration of lead 84. This structure also facilitates repair or rework of bumps to provide overall manufacturing cost savings.

Figure 8:
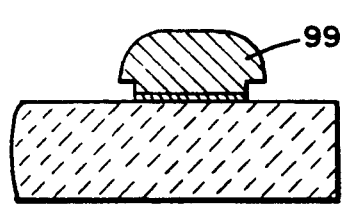
FIG. 8 is a cross section elevation view of a prior art gold bump manufactured by a spin-on resist process.
Figure 9:
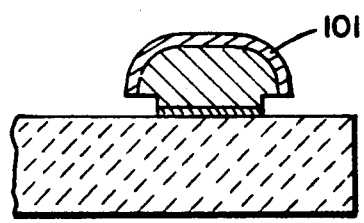
FIG. 9 is a cross section elevation view of a spun-on resist solid base bump with a tin cap.
Figure 10:
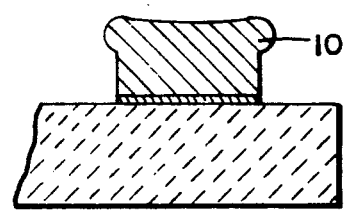
FIG. 10 is a cross section elevation view of a prior art vertical wall gold bump manufactured by a dry film resist process.

Prior art bumps comprising only gold, such as bumps 99, 100 in FIGS. 8 and 10, must have a height uniformity of within ±1 micrometer. However, a preferred tin cap on solid base bump, such as bumps 101, 102 in FIGS. 9 and 11, allow about ±5 micrometers of bump height non-uniformity. Thus, preferred tin cap on solid base, such as a gold or nickel base, bumps 98, 101, and 102 provide non-organic non-collapsible height standoff means while also permitting sufficient travel or penetration of conductive leads into the tin caps to achieve higher reliability during bonding over prior art bump structures.

Figure 11:
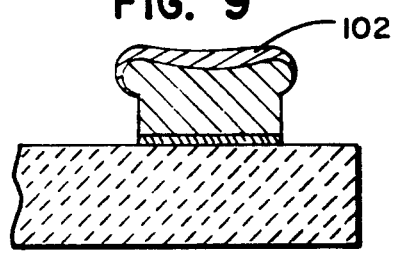
FIG. 11 is a cross section elevation view of a vertical wall dry film resist solid base bump with a tin cap.

FIGS. 8 and 9 show bumps manufactured using spin-on resist processes while FIGS. 10 and 11 show bumps manufactured using dry film resist processes. Note the novel structures shown in the tin capped bumps 101, 102 of FIGS. 9 and 11 respectively. These tin cap on solid base bumps overcome the bond reliability and organic matter problems of the prior art. This novel bump structure also overcomes the prior art bond site fatigue and tin whiskering problems. Even further, the high strength tin cap on solid base bump invention permits use of materials having compatible coefficients of expansion and which permit reflow and bonding at temperatures and pressures which are lower than in the prior art.

In operation, a preferred tin cap on solid base bump 98 typically comprises approximately 5 microns of tin positioned on top surface 97 of bump lower portion 92, shown generally in FIG. 7, in which the bump lower portion 92 material typically comprises approximately 30 microns of solid base material, such as gold or the like. Preferably, the bonding process uses a furnace bond process to further minimize the shock of bonding leads 84 onto die 90. Thus, a method of providing a low temperature and high reliability bond between electronic components is provided. This method includes the steps of providing first and second electronic components; providing a bump for placement onto the first electronic component, the bump having a lower portion 92 comprising an effective amount of solid or non-collapsible conductive metal (e.g. gold or nickel) base material to provide non-organic standoff height during the bonding process; placing an effective amount of tin bonding material on top of the solid base material; positioning the second electronic component proximate the tin, as shown in FIGS. 6 and 7 by force labels F and F' respectively; and reflowing the tin to provide a bond between the first and second electronic components and to provide a bond between the solid base material and the tin bonding material. This method preferably includes a first electronic component comprising a lead, such as lead 84, of a leadframe, and a second electronic component comprising a die, such as die 90, which may be a semiconductor chip or wafer, or similar bump-carrying device. A preferred method of providing a low-temperature high-reliability bond between electronic components preferably comprises the step of reflowing the tin within a furnace heater.

Another method is provided according to the present tin cap on solid base bump invention. This method includes providing furnace bonding of a semiconductor chip to the conductive elements of a leadframe. This method comprises the steps of positioning a semiconductor chip comprising a plurality of bonding locations in a holding member with a chip support surface. Then, preformed bonding material is provided at the bonding locations, the preformed bonding material comprising a non-collapsible conductive metal lower portion for providing non-organic standoff height during the bonding process and a reflowable tin cap upper portion for connecting conductive elements of a leadframe with the chip bonding locations. The conductive elements of a leadframe are then aligned with corresponding bonding locations on the semiconductor chip, and the leadframe conductive elements are moved toward the chip bonding locations so that the bonding material is arranged between the conductive elements and the chip bonding locations. A furnace bond heating process is then used for heating the bonding material to a point of reflow so that all of the conductive elements are bonded to the bonding material tin cap upper portions and the tin cap upper portions are alloyed to the non-collapsible lower portions. A further step comprises cooling the bonding material and the leadframe conductive elements.

Yet another problem within the field of electronic component packaging involves the manner of connecting leadframe conductive elements to variously spaced next levels of packaging. It is quite common for manufacturers of conductive leadframes, such as tab leadframes, to design different leadframes to match differently pitched printed circuit board footprints. However, prior art leadframes do not have structure enabling the leadframes to be used with only slight modification with differently pitched next level of packaging bond site patterns. Therefore, what has been needed has been an efficient and variable pitch tab leadframe assembly as partially shown in the fragmentary view of FIG. 12.

Figure 13:
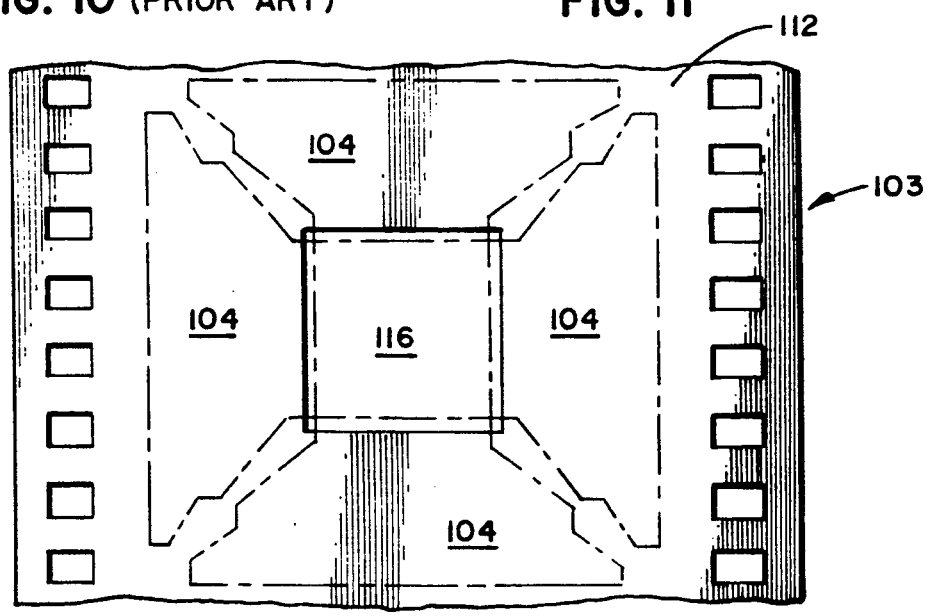
FIG. 13 is a top plan view of a representative tape leadframe illustrating four sections generally analogous to that shown in FIG. 6 to form a complete variable pitch tab leadframe about a central package area.
Figure 12:
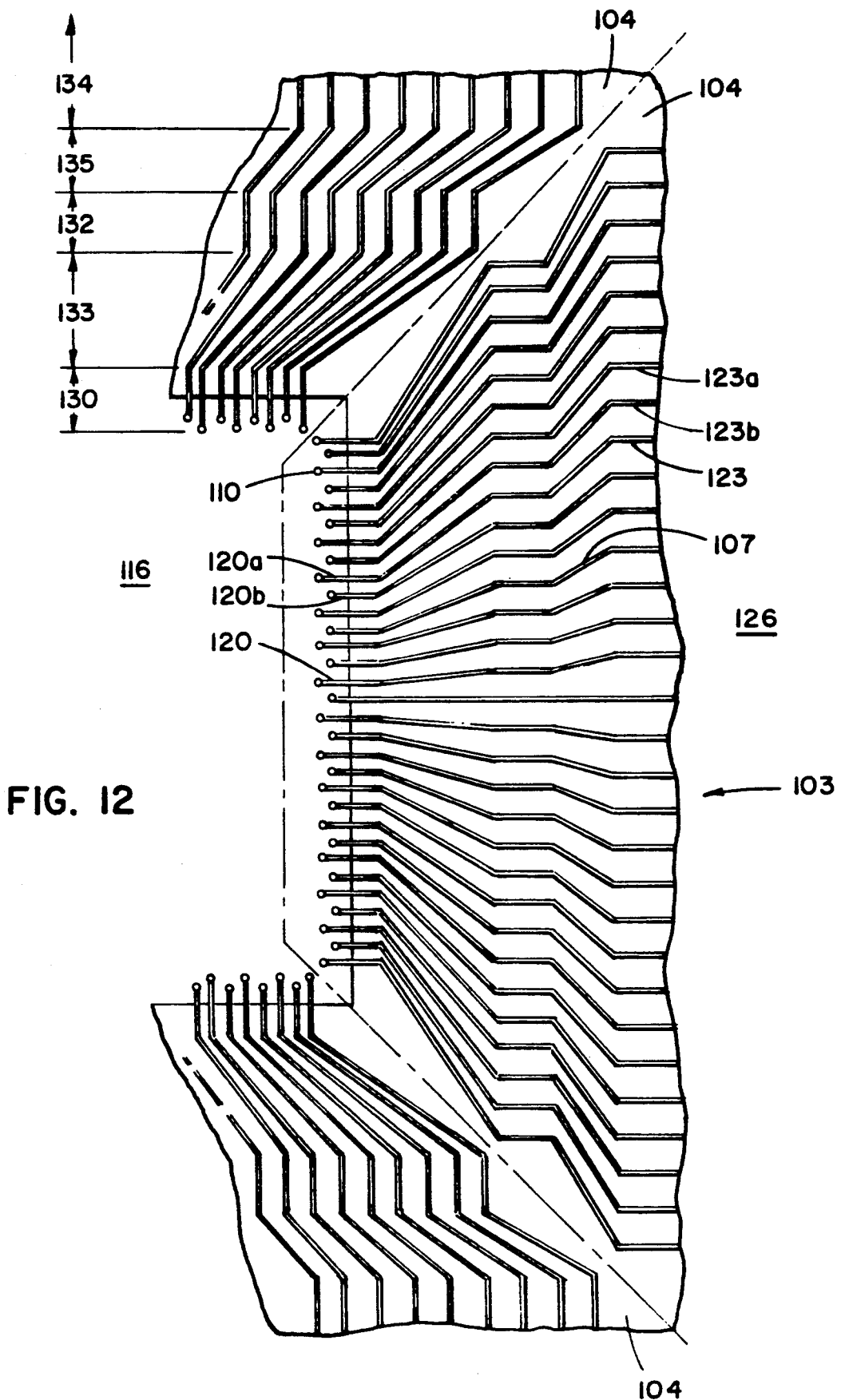
FIG. 12 is a top fragmentary view of a variable pitch tab leadframe.

Referring to FIG. 12, a fragmentary view of a variable pitched tab leadframe assembly 103 is illustrated in which a plurality of substantially identical leadframe assembly segments 104 are shown each comprising patterned conductive elements 107 for transmitting input and output signals to bonding locations 110 on an electronic device. variable pitch tab leadframe assembly 103 also comprises means for providing a variable pitch to conductive elements 107 to accommodate a plurality of standard pitch bond site printed circuit board footprints, such as footprints designated by JEDEC standards. FIG. 12 shows a fragment of a typical tab leadframe assembly according to the variable pitch leadframe assembly invention and may be appreciated more fully in the context of FIG. 13 which illustrates, in dotted lines, the relative relation of the fragment of FIG. 12 when combined with other fragments to form a complete representative outline of a typical variable pitch tab leadframe assembly 103 positioned preferably as one of a plurality of such leadframe assemblies on a sprocketed tape 112. In FIGS. 12 and 13, a central region labelled 116 represents the area in which a die, a semiconductor chip, or the like, is placed for interconnection with variable pitch tab leadframe assembly 103.

Preferred variable pitch tab leadframe assembly segment 104 comprises means for providing a variable pitch to conductive elements 107, conductive elements 107 each comprising a first end portion 120 arranged for connection with a semiconductor chip package located in area 116. Each conductive element also comprises a second end portion 123, the location of which is selected by the manufacturer, which is arranged for connection with a next level of packaging. Preferably, first end portions 120 of adjacent conductive elements have a first pitch spacing, and second end portions 123 of said adjacent conductive elements have a second pitch spacing which is different than the first pitch spacing. In FIG. 12, this relationship is represented by adjacent conductive elements first and second end portions labelled 120a, 120b, and 123a, 123b respectively. Variable pitch tab leadframe assembly segments 104 may comprise a plurality of parallel sections each having a pitch spacing corresponding to, for example, a JEDEC standard pitch spacing commonly used within the field of component packaging. For example, the pitch spacing between lead second end portions may be 50 mils (1.25 mm), 40 mils (1.0 mm), 25 mils (0.625 mm), 20 mils (0.5 mm), or even less. However, as the number of leads increases and greater density of packaging is pursued, the pitch of packaging continues to decrease. Yet each time a different pitch is used on a package, it may require a package leadframe-to-board spacing specifically for that pitch.

Thus, this variable pitch tab leadframe invention provides leadframe assembly segments 104 which comprise conductive elements 107 for connection with a package such that the package may be connected to variously pitched next levels of packaging, and vice versa. This may be accomplished by taking a tightly pitched package and attaching a leadframe to it that has and relies on the tab design to change the leadframe-to-board pitch. Tab leadframe assembly segment 104 preferably comprises interconnect sites which are fanned out along each conductive element to various desired pitches. This permits the chip manufacturer to provide a packaged device to a variety of users depending upon the user's sophistication in bonding devices to next levels of packaging using tight pitches. In other words, one size of variable pitch tab leadframe assemblies 103 may be used on many differently pitched printed circuit boards and package arrangements by cutting conductive elements 107 for desired pitch lengths at second ends 123 from a plurality of preexisting second end pitch patterns on conductive elements 107. This results in substantial savings in that manufacturers do not have to tool new leadframes and packages for each different board or user requirement. It is to be understood that pitch spacing greater than or less than those exemplary pitch spacings indicated above are envisioned within the scope of this invention, as is the number of parallel sections on conductive elements 107 for achieving numerous different pitches.

FIG. 12, therefore, illustrates a variable pitch tab leadframe assembly 103 for providing connection between a semiconductor chip package, which would be located in area 116, and a next level of packaging, which would be located in an area generally designated 126 corresponding to a printed circuit board or the like. Variable pitch tab leadframe assembly 103 also preferably comprises leadframe assembly segments 104 comprising a plurality of patterned conductive elements 107 for transmitting input and output signals to bonding locations on an electronic device. Variable pitch tab leadframe assembly 103 also preferably comprises means for providing a variable pitch pattern to conductive elements 107 each comprising a first section 130 and a second section 132 in which adjacent conductive elements are arranged in parallel, and a third section 133 in which adjacent conductive elements 107 are in non-parallel, the first and second sections being connected by the third section. Also, each conductive element 107 preferably comprises a first end portion 120 for connection with a semiconductor chip package and a second end portion 123 for connection with a next level of packaging. It is to be understood that second end portions 123 may be located at various lengths or pitches, as shown in FIGS. 12-16. First end portions 120 of adjacent conductive elements 107 preferably have a first pitch spacing and second end portions 123 of said adjacent conductive elements 107 have a second pitch spacing which is different than the first pitch spacing. Thus, the pitch spacing on preferred variable pitch tab leadframe assembly 103 between adjacent conductive elements 107 differs between the first and second sections.

Figure 14:
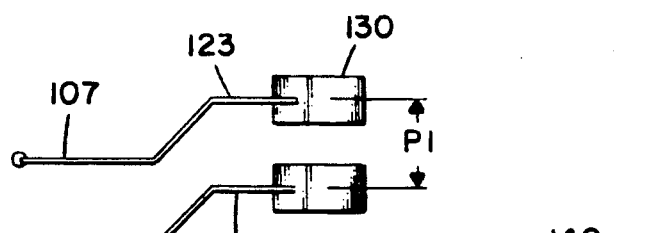
FIG. 14 is a top plan schematic view of the second end portions of adjacent conductive elements of a variable pitch tab leadframe having a first pitch at bond pads of a next level of packaging.
Figure 15:
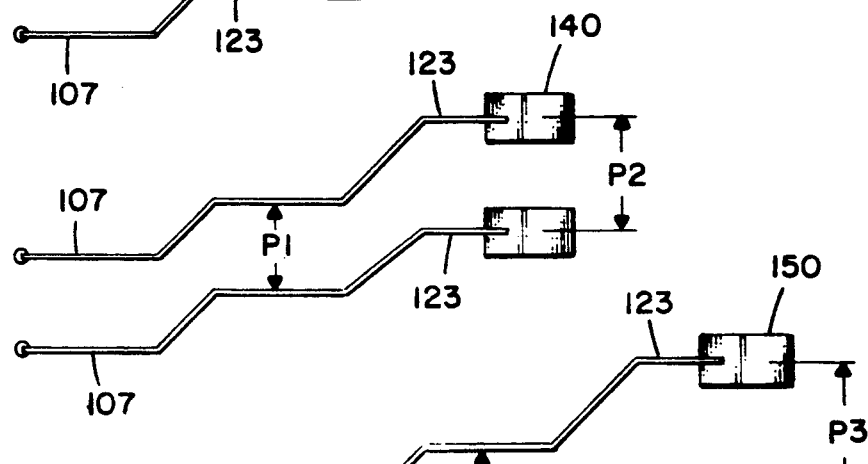
FIG. 15 is a top plan schematic view of the second end portions of adjacent conductive elements of a variable pitch tab leadframe having a second pitch at bond pads of a next level of packaging.
Figure 16:
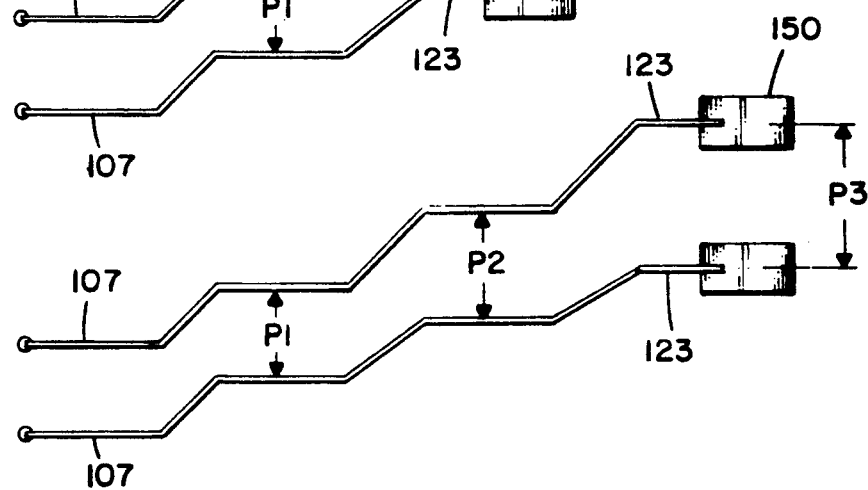
FIG. 16 is a top plan schematic view of the second end portions of adjacent conductive elements of a variable pitch tab leadframe having a third pitch at bond pads of a next level of packaging.

Although various pitch spacings may be utilized in a variable pitch tab leadframe assembly 103 of the present invention, first end portions 120 of adjacent conductive elements 107 are spaced at any practicable pitch. Similarly, the corresponding second end portions of adjacent conductive elements 107 may be spaced at a pitch of generally between about 5 mils (0.125 mm) and 50 mils (1.25 mm). It is appreciated that the next level of packaging user will determine the appropriate pitch for leadframe-to-board attach. For example, as illustrated in FIGS. 14-16, adjacent conductive element second end portions 123 comprise different pitches depending on where the conductive elements 107 are severed, as determined by the pitch of the bond sites at the next level of packaging. In FIG. 14, second end portions 123 are shown positioned at corresponding bond pads 130 having a pitch P1. In contrast, FIG. 15 illustrates a next level of packaging requirement with bond pads 140 having a pitch P2 that is different from pitch P1. Similarly, FIG. 16 illustrates another packaging requirement for which a pitch P3 exists between bond pads 150. No prior art tab leadframe assembly is known or available with structure to accommodate the multiple next level of packaging pitch requirements as depicted in FIGS. 14-16, or more. However, variable pitch tab leadframe assembly 103 may be used for various pitch requirements with the great advantages of simplicity, material efficiency, and savings of electronic packaging time, and is thus preferred.

A method of providing a tab leadframe assembly is also provided which permits electrical connection between a semiconductor chip package and a next level of packaging comprising various steps. These steps preferably comprise providing a leadframe as shown substantially as in FIG. 12 comprising a plurality of patterned conductive elements; arranging the pattern of the leadframe conductive elements to provide a first section 130, a second section 132, and a third section 134 in which adjacent conductive elements are arranged in parallel, and a fourth section 133 and a fifth section 135 in which adjacent conductive elements are arranged in non-parallel fanned relation and which provide interconnection between the first, second, and third sections. Further, the step of arranging the pattern of the leadframe conductive elements may comprise providing a plurality of first, second, and third sections so that the pitch spacing of adjacent conductive elements differs between the first, second, and third sections. Further sections may be included following the above method of manufacture.

It is to be understood that while certain embodiments of the present invention have been illustrated and described, the invention is not to be limited to the specific forms, sizes, or arrangements of parts described and shown above, since others skilled in the art may devise other embodiments still within the limits of the claims.

What is claimed is:

1. A method of manufacturing a yield-enhancing shadow mask for providing vapor deposition patterns of bonding metals onto input/output interconnect locations of a semiconductor die while preventing damage to active regions of the die, comprising:
  a) providing a shadow mask having a top surface and a bottom surface;
  b) obtaining and transferring applicable dimensions of the semiconductor die to the shadow mask in order to define a plurality of vias in the shadow mask located in alignment with the input/output interconnect locations of the die for permitting vaporized bonding metals to pass through the mask and deposit onto the input/output interconnect locations; and
  c) obtaining and transferring applicable dimensions of the semiconductor die in order to form the mask bottom surface so that it comprises a plurality of recessed regions which minimize the contact area of the mask with the die during the process of vapor deposition, the recessed regions being formed so that they surround substantially full-mask-thickness walls which define the vias aligned with the input/output interconnect locations of the die and which provide damming action to retain the vapor deposit to within a limited distance of the input/output interconnect locations of the die as defined by the vias, the forming step comprising forming the recessed regions in the mask so that they are formed over active regions of the die in order to avoid damage to the active regions from contact with the mask, thus increasing the yield of reliable die during the production process.

2. The method of claim 1 wherein the forming step comprises etching.

3. The method of claim 1 wherein the forming step comprises providing projections extending annularly from the vias at the bottom surface of the mask.

4. The method of claim 3 wherein the forming step comprises etching.

5. The method of claim 1 wherein the providing step comprises providing a mask formed of a material comprising molybdenum.

6. A method of manufacturing a yield-enhancing shadow mask for providing vapor deposition patterns of bonding metals onto input/output interconnect locations of a semiconductor die while preventing damage to active regions of the die, comprising:
  a) providing a shadow mask having a top surface and a bottom surface;
  b) obtaining and transferring applicable dimensions of the semiconductor die to the shadow mask in order to define a plurality of vias in the shadow mask located in alignment with the input/output interconnect locations of the die for permitting vaporized bonding metals to pass through the mask and deposit onto the input/output interconnect locations; and
  c) obtaining and transferring applicable dimensions of the semiconductor die to the shadow mask in order to etch the mask bottom surface so that it comprises a plurality of recessed regions which minimize the contact area of the mask with the die during the process of vapor deposition, the recessed regions being formed so that they surround substantially full-mask-thickness walls which define the vias aligned with the input/output interconnect locations of the die and which provide damming action to retain the vapor deposit to within a limited distance of the input/output interconnect locations of the die as defined by the vias, the etching step comprising etching the recessed regions in the mask so that they are formed over active regions of the die in order to avoid damage to the active regions from contact with the mask, thus increasing the yield of reliable die during the production process.

7. The method of claim 6 wherein the providing step comprises providing a mask formed of a material comprising molybdenum.

8. A method of manufacturing and using a yield-enhancing shadow mask for providing vapor deposition patterns of bonding metals onto input/output interconnect locations of a semiconductor die while preventing damage to active regions of the die, the method comprising:
  (a) providing a shadow mask having a top surface and a bottom surface;
  (b) defining a plurality of vias in the shadow mask located in alignment with the input/output interconnect locations of the die for permitting vaporized bonding metals to pass through the mask and deposit onto the input/output interconnect locations;
  (c) forming the mask bottom surface so that it comprises a plurality of recessed regions which minimize the contact area of the mask with the die during the process of vapor deposition, the recessed regions being formed so that they surround substantially full-mask-thickness walls which define the vias aligned with the input/output interconnect locations of the die and which provide damming action to retain the vapor deposit to within a limited distance of the input/output interconnect locations of the die as defined by the vias, the forming step comprising forming the recessed regions in the mask so that they are formed over active regions of the die in order to avoid damage to the active regions from contact with the mask, thus increasing the yield of reliable die during the production process;

(d) positioning the mask over the die so that the plurality of vias are aligned with the input/output interconnect locations of the die and so that the recessed regions are located over the active regions of the die;

(e) causing a vaporized bonding metal to pass through the vias and deposit onto the input/output interconnect locations of the die; and (f) removing the mask from the die.

9. The method of claim 8 wherein the forming step comprises etching.

10. The method of claim 8 wherein the forming step comprises providing projections extending annularly from the vias at the bottom surface of the mask.

11. The method of claim 10 wherein the forming step comprises etching.

12. The method of claim 8 wherein the providing step comprises providing a mask formed of a material comprising molybdenum.

13. A method of manufacturing and using a yield-enhancing shadow mask for providing vapor deposition patterns of bonding metals onto input/output interconnect locations of a semiconductor die while preventing damage to active regions of the die, the method comprising:

(a) providing a shadow mask having a top surface and a bottom surface;

(b) defining a plurality of vias in the shadow mask located in alignment with the input/output interconnect locations of the die for permitting vaporized bonding metals to pass through the mask and deposit onto the input/output interconnect locations;

(c) etching the mask bottom surface so that it comprises a plurality of recessed regions which minimize the contact area of the mask with the die during the process of vapor deposition, the recessed regions being formed so that they surround substantially full-mask-thickness walls which define the vias aligned with the input/output interconnect locations of the die and which provide damming action to retain the vapor deposit to within a limited distance of the input/output interconnect locations of the die as defined by the vias, the etching step comprising etching the recessed regions in the mask so that they are formed over active regions of the die in order to avoid damage to the active regions from contact with the mask, thus increasing the yield of reliable die during the production process;

(d) positioning the mask over the die so that the plurality of vias are aligned with the input/output interconnect locations of the die and so that the recessed regions are located over the active regions of the die;

(e) causing a vaporized bonding metal to pass through the vias and deposit onto the input/output interconnect locations of the die; and (f) removing the mask from the die.

14. The method of claim 13 wherein the providing step comprises providing a mask formed of a material comprising molybdenum.

* * * * *